(12) United States Patent
Negishi

(10) Patent No.: US 8,334,647 B2
(45) Date of Patent: Dec. 18, 2012

(54) ORGANIC EL DEVICE AND AN ORGANIC EL DEVICE PRODUCING METHOD

(75) Inventor: Toshio Negishi, Chigasaki (JP)

(73) Assignee: Ulvac, Inc., Chigasaki-shi (JP)

( * ) Notice: Subject to any disclaimer, the term of this patent is extended or adjusted under 35 U.S.C. 154(b) by 0 days.

(21) Appl. No.: 12/567,068

(22) Filed: Sep. 25, 2009

(65) Prior Publication Data

US 2010/0013387 A1 Jan. 21, 2010

Related U.S. Application Data

(63) Continuation of application No. PCT/JP2008/054877, filed on Mar. 17, 2008.

(30) Foreign Application Priority Data

Mar. 26, 2007 (JP) .................................. 2007-078253
Apr. 13, 2007 (JP) .................................. 2007-105916

(51) Int. Cl.
*H01J 1/62* (2006.01)

(52) U.S. Cl. ...................................................... 313/504

(58) Field of Classification Search .................. 313/498, 313/502–504, 506; 445/24–25; 428/690, 428/917
See application file for complete search history.

(56) References Cited

U.S. PATENT DOCUMENTS

| 6,107,734 | A | 8/2000 | Tanaka et al. ................. 313/506 |
| 6,703,180 | B1 * | 3/2004 | Boroson et al. ................ 430/200 |
| 7,271,537 | B2 | 9/2007 | Matsuda | |
| 2002/0004146 | A1 * | 1/2002 | Kido et al. .................... 428/690 |
| 2004/0036421 | A1 | 2/2004 | Arnold | |
| 2006/0119255 | A1 | 6/2006 | Kimura ......................... 313/504 |
| 2006/0263637 | A1 | 11/2006 | Ohsawa et al. ............... 428/690 |
| 2007/0015307 | A1 | 1/2007 | Ishizuka | |
| 2007/0034856 | A1 | 2/2007 | Ohsawa | |
| 2007/0035235 | A1 | 2/2007 | Liu et al. ....................... 313/504 |

FOREIGN PATENT DOCUMENTS

| JP | 11-329748 | 11/1999 |
| JP | 2000-113976 | 4/2000 |
| JP | 2004-22176 A1 | 1/2004 |

(Continued)

OTHER PUBLICATIONS

International Search Report for International Application No. PCT/JP2008/054877 dated Apr. 8, 2008.

(Continued)

*Primary Examiner* — Anh Mai
*Assistant Examiner* — Brenitra Lee
(74) *Attorney, Agent, or Firm* — Kratz, Quintos & Hanson, LLP

(57) ABSTRACT

A technology is provided, which obtains an organic EL device free from any reduction in the luminescent efficiency, even if an electrode layer is formed on a surface of a charge injection layer by a sputtering method. An organic EL device of the present invention includes a first charge injection layer, a first organic layer, and a second charge injection layer. The second charge injection layer is formed as a mixed layer in which a matrix organic material and a charge injectable metallic material are mixed. Even when the electrode layer is formed on a surface of this second charge injection layer by the sputtering method, the luminescent efficiency does not decrease.

10 Claims, 9 Drawing Sheets

FOREIGN PATENT DOCUMENTS

| | | |
|---|---|---|
| JP | 2004-79538 A | 3/2004 |
| JP | 2004-164992 A1 | 6/2004 |
| JP | 2004-319504 A1 | 11/2004 |
| JP | 2005-26003 A1 | 1/2005 |
| JP | 2006-210890 A1 | 8/2006 |
| JP | 2006-302506 A1 | 11/2006 |
| JP | 2007-73500 A1 | 3/2007 |
| KR | 10-2006-0051976 | 5/2006 |
| WO | WO 2006/104221 A1 | 10/2006 |

OTHER PUBLICATIONS

Supplementary European Search Report dated Feb. 17, 2011.
Office Action dated Oct. 11, 2010 issued in corresponding Chinese Patent Application No. 200880010215.4 with English translation.
Korean Office Action issued in counterpart application No. 2009-7020087 on Dec. 29, 2011 with English translation (11 pages).

* cited by examiner

ORGANIC EL DEVICE AND AN ORGANIC EL DEVICE PRODUCING METHOD

The present invention is a Continuation of International Application No. PCT/JP2008/054877 filed Mar. 17, 2008, which claims priority to Japan Patent Documents No. 2007-078253, filed on Mar. 26, 2007, and No. 2007-105916, filed on Apr. 13, 2007. The entire disclosures of the prior applications are hereby incorporated by reference herein in their entireties.

TECHNICAL FIELD

The present invention generally relates to a technical field of an organic EL device. More particularly, the invention relates to a technology for forming an electrode layer on a surface of a charge injection layer.

BACKGROUND ART

Previously, an organic EL device as shown by a reference numeral 201 in FIG. 9 is known as such a kind of organic EL device.

In this organic EL device 201, a wiring layer 203, a hole injection layer 204, a hole transporting layer 208, a luminescent layer 209, an electron transporting layer 210, an electron injection layer 206, and an electrode layer 207 are formed on a surface of a substrate 202 in this order.

A first organic layer 205 is constituted by the hole transporting layer 208, the luminescent layer 209 and the electron transporting layer 210.

A side of the first organic layer 205 that contacts the electron injection layer 206 is the electron transporting layer 210, which is a thin film composed mainly of an organic material having electron transportability.

The electron injection layer 206 is a thin film composed of a metallic material having electron injectability; and for example, a single material or a chemical compound of an alkali metal element (such as, lithium or an alkaline earth metal element) is used.

In this organic EL device 201, the electron injection layer 206 is formed on a surface of the first organic layer 205 by a vapor deposition method, and the electrode layer 207 is formed on a surface of the electron injection layer 206 by the vapor deposition method.

In the vapor deposition method for the electrode layer 207, problems (such as, a deformation of a mask) occur due to a heat load during the film formation, which make larger substrates difficult. Therefore, the formation of the electrode layer 207 by a sputtering method has been tried.

However, it is known that when the electrode layer 207 is formed by the sputtering method, the luminescent efficiency is deteriorated. Thus, a solution has been sought.

Meanwhile, in an organic EL device 301 of FIG. 15, a wiring layer 303, a first luminescent part 320, an electrode layer 311, a second luminescent part 321 and an electrode layer 304 are formed on the substrate 302.

First and second luminescent parts 320, 321 comprise first and second organic layers 305, 306, first and second hole injection layers 307, 308 being disposed on those surfaces of the first and second organic layers 305, 306 which are at sides of the substrate 302, respectively; and first and second electron injection layers 309, 310 are disposed on surfaces at the opposite sides.

The electrode layer 311 separates the first electrode injection layer 309 and the second hole injection layer 308 having different polarities from each other, and the first electron injection layer 309 and the second hole injection layer 308 are electrically connected.

When a voltage is applied between the wiring layer 303 and the electrode layer 304, voltages are applied between the first hole injection layer 307 contacting the wiring layer 303 and the first electron injection layer 309 connected to the electrode layer 311 and between the second electron injection layer 310 contacting the electrode layer 304 and the second hole injection layer 308 connected to the electrode layer 311, so that holes are injected from the first and second hole injection layers 307, 308 into the first and second organic layers 305, 306 and electrons are injected from the first and second electron injection layers 309, 310 into the first and second organic layers 305, 306. The injected holes and the electrons are recombined with each other inside the first and second organic layers 305, 306, respectively, thereby generating light.

In this embodiment, the substrate 302 is transparent; the wiring layer 303 and the second organic layer 306 on the substrate 302, and each of the layers 307, 305, 309, 311 and 308 therebetween are transparent. Thus, the light radiated in the first organic layer 305 is emitted from the first organic layer 305 to the outside of the substrate 302 through the first hole injection layer 307 and the wiring layer 303. The light radiated in the second organic layer 306 is emitted from the second organic layer 306 to the outside of the substrate 302 through each of the layers 308, 311, 309, 305 and 307 among the substrate 302 and the second organic layer 306. The light from the second organic layer 306 is emitted toward the same side as in the case of the light from the first organic layer 305, so that an emitted strong light in which both the lights are combined is observed at a place on the side of the substrate 302 outside the organic EL device 301.

There is a sputtering method as a method for forming a thin film composed of a metal (such as, the electrode layer 311) on the surface of the first electron injection layer 309.

The first electron injection layer 309 is a thin film of a metallic compound having the electron injectability; and the first organic layer 305 is constituted by a thin film of an organic compound. It is known that when the electrode layer 311 of a metal is formed on a surface of the first electron injection layer 309 as the thin film of the organic compound by sputtering a metallic target, the luminescent efficiency decreases more as compared to the film formation by the vapor deposition method.

For this reason, the vapor deposition method is used in forming the electrode layer 311 on the surface of the first electron injection layer 309.

However, since the vapor deposition method has problems (such as, a slow film forming speed), a technology has been sought, which can form the electrode layer 311 by the sputtering method, while the luminescent efficiency equivalent to that in the vapor deposition method is maintained. See, Nos. JP-A 2004-79538, JP-A 2006-302506, JP-A 2005-26003, and 2004-164992.

DISCLOSURE OF THE INVENTION

Problems to be Solved by the Invention

The present invention, which has been invented to solve the above-mentioned problems of the prior art, aims at providing a technology which does not decrease the luminescent efficiency even when an electrode layer is formed on a surface of a second charge injection layer by a sputtering method.

Measures to Solve the Problems

Through investigations to solve the above problems, it is presumed that the decrease in the luminescent efficiency is due to the fact that since the composition of a material changes significantly in an interface between the second charge injection layer and the first organic layer in the conventional organic EL device, the state of the interface is disturbed due to the influence caused by the invasion of sputtered particles as compared with that before the electrode layer is formed; and the injection efficiency of charges from the second charge injection layer into the first organic layer decreases.

Accordingly, in order to prevent the decrease in the luminescent efficiency, it is only necessary to maintain the state in which the second electron injection layer is formed in forming the electrode layer by sputtering.

In view of the above, the present invention was invented, the invention being directed to an organic EL device in which charges are injected into a luminescent layer of an organic thin film formed between a first electrode layer and a second electrode layer, thereby emitting light. The organic EL device comprises a charge injection layer formed between the luminescent layer and the second electrode layer, and a charge transporting layer formed between the luminescent layer and the charge injection layer, wherein the charge transporting layer is constituted by a matrix organic material, the charge injection layer consisting of a thin film in which a charge injectable metallic material and the same matrix organic material as the charge transporting layer are mixed, and a metallic film formed by a sputtering method being disposed on a surface of the charge injection layer.

The present invention is directed to the organic EL device, wherein the nearer the charge injection layer is to the charge transporting layer, the larger the proportion of the matrix organic material becomes.

The present invention is directed to the organic EL device, wherein the charge injectable metallic material of the charge injection layer is lithium, and the matrix organic material is $Alq_3$.

The present invention is directed to the organic EL device, wherein the weight ratio of the lithium in the charge injection layer is 2%.

The present invention is directed to the organic EL device, wherein the charge transporting layer is formed by being deposited by a vapor of the matrix organic material alone, and the charge injection layer is formed by being deposited by both vapor of the matrix organic material and vapor of the charge injectable metallic material.

The present invention is directed to the organic EL device producing method for producing an organic EL device having a luminescent layer of an organic thin film formed between a first electrode layer and a second electrode layer, a charge injection layer formed between the luminescent layer and the second electrode layer, and a charge transporting layer formed between the luminescent layer and the charge injection layer. The organic EL device producing method comprises a charge transporting layer forming step in which the charge transporting layer is formed by depositing by a vapor of a matrix organic material alone; a charge injection layer forming step in which the charge injection layer is formed by depositing both vapor of the matrix organic material and vapor of the charge injectable metallic material; and a second electrode layer forming step in which the second electrode layer on a surface of the charge injection layer is formed by a sputtering method.

The present invention is directed to the organic EL device producing method. In the charge injection layer forming step, the charge injection layer is formed at a higher proportion of the vapor of the matrix organic than that of the charge injectable metallic material at the start of the formation of a film and at a higher proportion of the vapor of the charge injectable metallic material than that of the matrix organic material at the end of the formation of a film in the vapor of the total of the matrix organic material and the charge injectable metallic material.

The present invention is directed to the organic EL device producing method, wherein the charge injectable metallic material of the charge injection layer is lithium, and the matrix organic material is $Alq_3$.

The present invention is directed to the organic EL device producing method, wherein the weight ratio of the lithium in the charge injection layer is 2%.

The present invention is directed to the organic EL device producing method generating the vapor of the matrix organic material in the charge transporting layer forming step and the vapor of the matrix organic material in the charge injection layer forming step from the same vapor deposition source and discharging them into the same vacuum chamber, thereby forming the charge transporting layer and the charge injection layer in the same vacuum chamber.

The present invention, which has been invented for the reasons discussed above, is directed to an organic EL device having a first charge injection layer, a first organic layer formed on a surface of the first charge injection layer, and a second charge injection layer formed on a surface of the first organic layer, wherein charges having opposite polarities to each other are injected from the first and second charge injection layers, respectively, into the first organic layer, and the first organic layer emits light. In the organic EL device, the second charge injection layer is constituted by a thin film in which a charge injectable metallic material to inject holes or electrons into the first organic layer and a matrix organic material to transport the charges having a polarity which the charge injectable metallic material injects are mixed.

The present invention is directed to the organic EL device, wherein a metallic film formed by a sputtering method is disposed on a surface of the second charge injection layer.

The present invention is directed to the organic EL device, wherein the metallic film injects, into the second charge injection layer, charges of the same polarity which the second charge injection layer injects into the first organic layer.

The present invention is directed to the organic EL device, which comprises a third charge injection layer disposed on the second charge injection layer, a second organic layer disposed on a surface of the third charge injection layer, and a fourth charge injection layer disposed on a surface of the second organic layer. The first and third charge injection layers having the same polarity are of a thin film of materials to inject charges of either hole or electron; and the second and fourth charge injection layers having the same polarity are constituted by a thin film of materials to inject charges having opposite polarity to the first and third charge injection layers out of hole and electron; and the charges of the same polarity as the first and second charge injection layers are injected from the third and fourth charge injection layers, respectively, into the second organic layer, and the second organic layer emits light.

The present invention is directed to the organic EL device, wherein a transparent electrode layer is formed on a surface of the second charge injection layer, and the third charge injection layer is disposed on the electrode layer.

The present invention is directed to the organic EL device, wherein the charge injectable metallic material of the second charge injection layer is lithium.

The present invention is directed to the organic EL device, wherein the matrix organic material of the second charge injection layer is contained in at least the first organic layer in contact with the second charge injection layer in the first organic layer.

The present invention is directed to the organic EL device, wherein the matrix organic material is $Alq_3$.

The present invention is directed to the organic EL device, wherein the second charge injection layer is formed by bringing a vapor of the matrix organic material and a vapor of the charge injectable metallic material together to an object to be film-formed.

The present invention is directed to an organic EL device producing method for producing an organic EL device having a first charge injection layer, a first organic layer formed on a surface of the first charge injection layer, and a second charge injection layer formed on a surface of the first organic layer, wherein charges having opposite polarities to each other are injected from the first and second charge injection layers, respectively, into the first organic layer, and a first luminescent layer contained in the first organic layer emits light. The present invention is directed to the organic EL device producing method for bringing a vapor of a matrix organic material and a vapor of a charge injectable metallic material together on the surface of the first organic layer to form the second charge injection layer of a thin film in which the matrix organic material and the charge injectable metallic material are mixed.

The present invention is directed to the organic EL device producing method, wherein an electrode layer is formed on a surface of the second charge injection layer by a sputtering method.

The present invention is directed to the organic EL device producing method, wherein, after forming the electrode layer having transparency, a third charge injection layer to inject charges having the same polarity as the first charge injection layer, a second organic layer containing a second luminescent layer, and a fourth charge injection layer to inject charges having the same polarity as the second charge injection layer are formed on the electrode layer.

Effect of the Invention

Even when the electrode layer is formed on the surface of the second charge injection layer by the sputtering method, the luminescent efficiency does not deteriorate.

BEST MODE FOR CARRYING OUT THE INVENTION

Figure 3:
FIGS. 3(a) to (e) are sectional views for illustrating steps of producing the organic EL device of the present invention.
Figure 3:
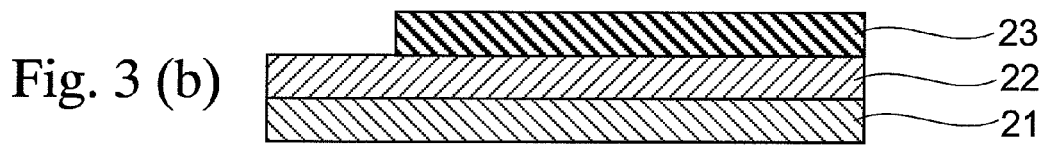
Figure 3:
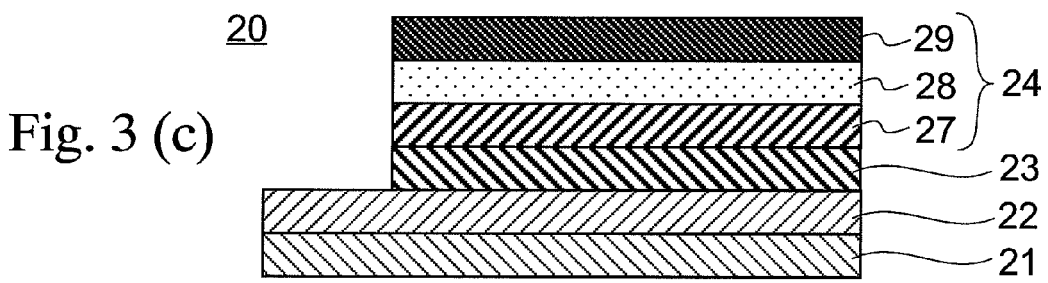
Figure 3:
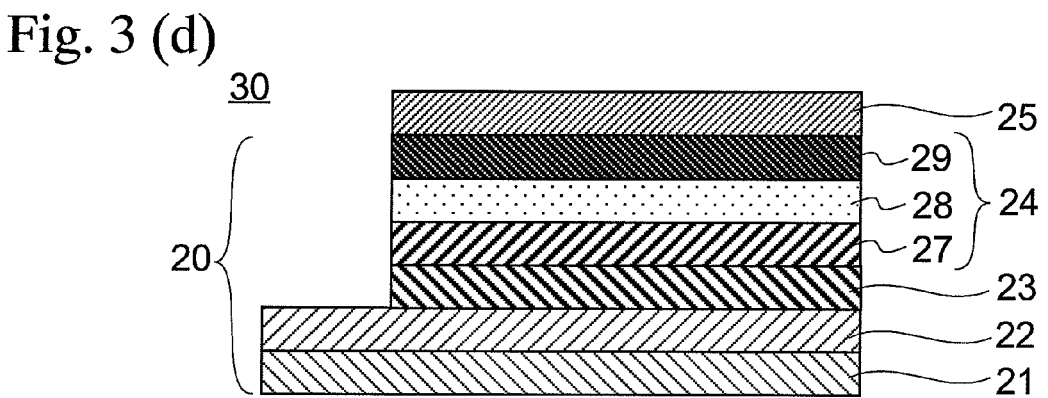
Figure 3:
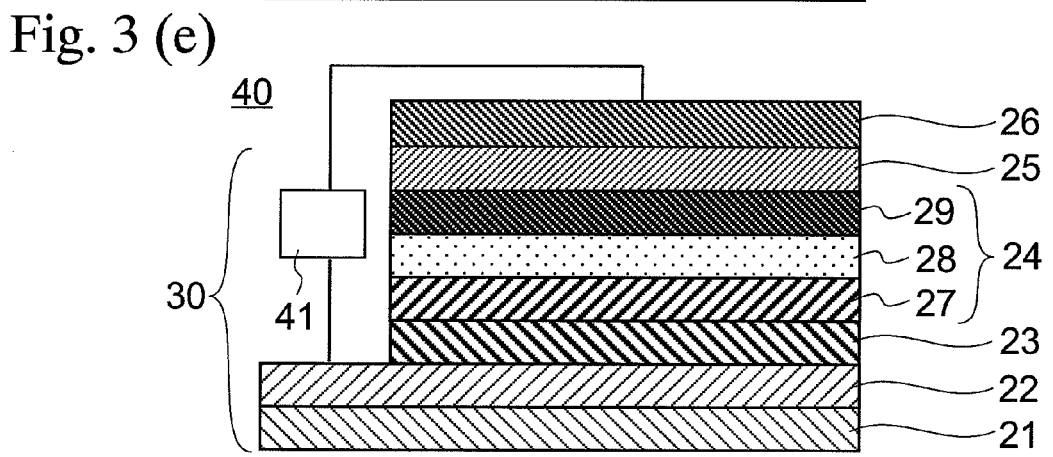

A sectional view of FIG. 3 (e) shows an embodiment of the organic EL device 40 of the present invention.

This organic EL device 40 has a plate-like substrate 21; and a wiring layer 22, a first charge injection layer 23, a first charge transporting layer 27, a luminescent layer 28, a second charge transporting layer 29, a second charge injection layer 25 and an electrode layer 26 are formed on a surface of the substrate 21 in this order from the side thereof.

The wiring layer 22 and the electrode layer 26 are connected to a power source 41.

The first charge injection layer 23 is formed by a material into which either holes or electrons are injected and through which they are transported; and the second charge injection layer 25 is constituted by a material into which charges having the opposite polarity to the first charge injection layer 23 are injected and through which they are transported.

The first organic layer 24 is constituted by a first charge transporting layer 27, a luminescent layer 28 and a second charge transporting layer 29.

When a voltage is applied between the wiring layer 22 and the electrode layer 26, either the holes or the electrons are injected from the first charge injection layer 23 into the first charge transporting layer 27, while the other are injected from the second charge injection layer 25 into the second charge transporting layer 29. The holes and the electrons are transported through the first and second charge transporting layers 27, 29; and the holes and the electrons move toward the luminescent layer 28. When the holes and the electrons reach the luminescent layer 28, they recombine within the luminescent layer 28 and generate light.

The substrate 21 is a transparent glass substrate, and the wiring layer 22 is transparent, so that the emitted light having passed through the wiring layer 22 and the substrate 21 is observed.

In this case, as the wiring layer 22, ITO (Indium-Tin-Oxide) or the like can be used.

As described later, in the present invention, the second charge injection layer 25 is constituted by a mixed layer of a thin film in which a matrix organic material 60 and a charge injectable metallic material 61 are mixed. The charge injectable metallic material 61 has charge injectability; and the matrix organic material 60 is an organic material in order to transport the charges injected from the charge injectable metallic material 61. The electrode layer 26 is formed on a surface of this second charge injection layer 25 by a sputtering method.

Steps of producing this organic EL device 40 will hereinafter be explained in reference to the drawings.

Figure 1:
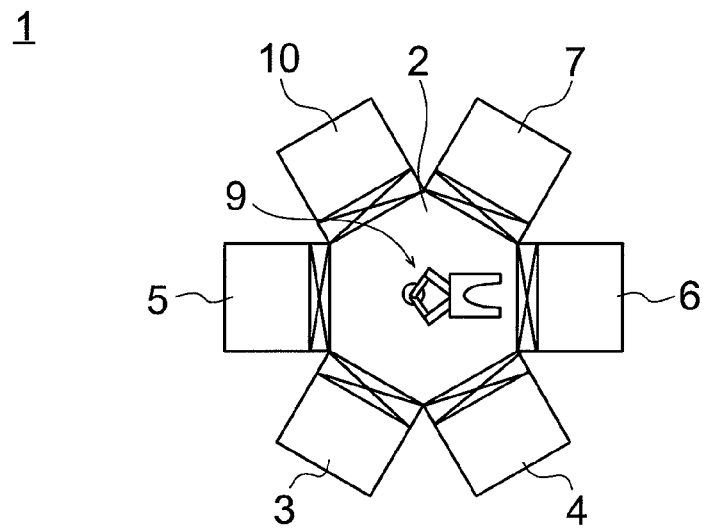
FIG. 1 is a block diagram for illustrating an organic EL device producing apparatus of the present invention.

In FIG. 1, a reference numeral 1 denotes an apparatus for producing the organic EL device 40 according to the present invention.

This producing apparatus 1 has a transportation equipment 2, and a carry-in equipment 3, a carry-out equipment 4, a first sputtering equipment 5, a first vapor deposition equipment 6, a second vapor deposition equipment 10 and a second sputtering equipment 7 are connected to the transportation equipment 2, respectively.

A substrate carriage robot 9 is disposed in the transportation equipment 2, and the substrate is carried in and out among the respective equipments 2 to 7 and 10.

A plurality of the substrates 21 on which the wiring layer 22 is formed (FIG. 3(a)) are preliminarily disposed in the carry-in equipment 3.

Each of the equipments 2 to 7 and 10 are shielded from the atmosphere, and evacuated under vacuum.

In this state, the substrates 21 on which the wiring layer 22 is formed are carried from the carry-in equipment 3 into the first sputtering equipment 5. Inside the first sputtering equipment 5, the wiring layer 22 is directed toward a target; and the first charge injection layer 23 is formed on a surface of the wiring layer 22 by the introduction of a sputtering gas and sputtering the target.

The wiring layer 22 is a thin film of metal (for example, a silver target), and the first charge injection layer 23 of a thin silver film is formed on the surface of the wiring layer 22.

After the first charge injection layer 23 is formed, the substrate 21 on which the first charge injection layer 23 is formed (FIG. 3(b)) is carried into the first vapor deposition equipment 6 from the first sputtering equipment 5; organic compounds corresponding to compositions of the respective layers 27, 28, 29 are disposed in three kinds of vapor deposition sources which correspond to the first charge transporting layer 27, the luminescent layer 28 and the second charge transporting layer 29; and a vapor of the organic compound is discharged from each vapor deposition source and reached to the surface of the first charge injection layer 23, so that the first organic layer 24 which is composed of the first charge transporting layer 27, the luminescent layer 28 and the second charge transporting layer 29 is formed.

A reference numeral 20 denotes an object to be film-formed on which the first organic layer 24 is formed (FIG. 3(c)). The object 20 to be film-formed is carried out from the first vapor deposition equipment 6; and carried into the vacuum chamber 11 of the second vapor deposition equipment 10.

Figure 2:
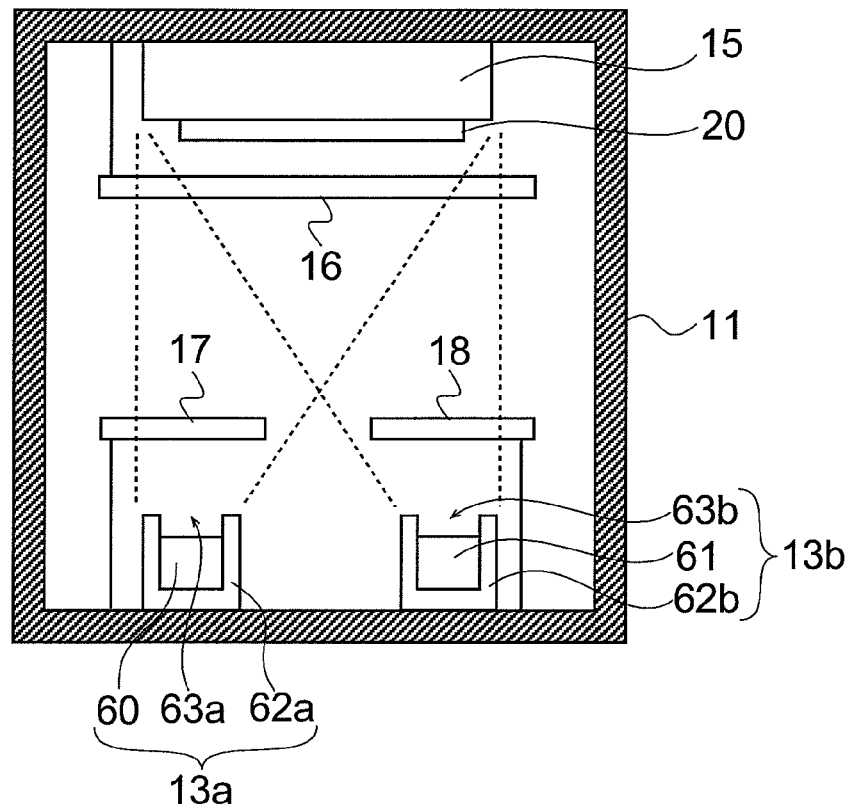
FIG. 2 is a sectional view for illustrating a vacuum vapor deposition equipment.

FIG. 2 is a sectional view for illustrating the interior of the second vapor deposition equipment 10, and the object 20 which is carried therein is held by a substrate holder 15 inside the vacuum chamber 11.

A first vapor deposition source 13a and a second vapor deposition source 13b are disposed under the substrate holder 15 inside the vacuum chamber 11; a matrix organic material 60 is placed in a vapor deposition vessel 62a of the first vapor deposition source 13a; and a charge injectable metallic material 61 is placed in a vapor deposition vessel 62b of the second vapor deposition source 13b.

The first and second vapor deposition sources 13a, 13b have discharge openings 63a, 63b at upper portions thereof. The matrix organic material 60 and the charge injectable metallic material 61 inside the first and second vapor deposition sources 13a, 13b are preliminarily heated by passing electric current through the first and second vapor deposition sources 13a, 13b.

After the substrate 20 to be film-formed is disposed on the substrate holder 15, the first and second vapor deposition sources 13a, 13b are further heated in a state in which the space between the substrate holder 15 and the first and second vapor deposition sources 13a, 13b is shielded by respective shutters 16 to 18; and a vapor of the matrix organic material 60 and a vapor of the charge injectable metallic material 61 are discharged through the discharge openings 63a, 63b of the first vapor deposition source 13a and the second vapor deposition source 13b, respectively.

When the evaporating states and the discharging speeds of the matrix organic material 60 and the charge injectable metallic material 61 are stabilized, the respective shutters 16 to 18 between the substrate holder 15 and the first and second vapor deposition sources 13a, 13b are opened; and the vapor of the matrix organic material 60 and that of the charge injectable metallic material 61 are discharged into the vacuum chamber 11.

The first and second vapor deposition sources 13a, 13b are set close to each other; and the substrate holder 15 is disposed at a place where both the vapors reach. A vapor in which the vapor of the matrix organic material 60 and that of the charge injectable metallic material 61 are mixed reaches the surface of the first charge injection layer 23, so that a thin film in which the matrix organic material 60 and the charge injectable metallic material 61 are mixed begins to grow on the surface of the first charge injection layer 23.

The thin film in which the matrix organic material 60 and the charge injectable metallic material 61 are mixed is grown for a predetermined time period. When the film reaches a predetermined film thickness, the respective shutters 16 to 18 are closed, and the growth of the thin film is terminated, so that the mixed layer of the matrix organic material 60 and the charge injectable metallic material 61 is formed as the second charge injection layer 25. In this case, the discharging rate per unit time of each of the vapors from the discharging openings 63a, 63b is made constant, so that the mixed layer can be obtained at a constant mixed ratio in the film thickness direction, while the composition does not change in the film thickness direction.

The object 20 to be film-formed on which the second charge injection layer 25 is formed is carried from the vacuum chamber 11 into the second sputtering equipment 7.

In FIG. 3(d), a reference numeral 30 denotes the object in which the second charge injection layer 25 is formed on the surface of the first organic layer 24.

The object 30 is held on the substrate holder; the second charge injection layer 25 is directed toward the target; and the electrode layer 26 is formed on a surface of the second charge injection layer 25 inside the second sputtering equipment 7 by the introduction of the sputtering gas and sputtering the target.

In this embodiment, aluminum is used as the target; and the electrode layer 26 of a wiring metal (such as, aluminum) is formed on the second charge injection layer 25 (FIG. 3(e)).

The object 30 to be film-formed on which the electrode layer 26 is formed is carried from the second sputtering equipment 7 into the carry-out equipment 4, taken out from the carrying-out equipment 4 and assembled, thereby obtaining an organic EL device 40.

In addition, according to the above embodiment, the matrix organic material 60 was placed in the vapor deposition source to form the second charge transporting layer 29; the second charge transporting layer 29 containing the matrix organic material 60 was formed; and a thin film containing the same matrix organic material 60 was formed (the second charge transporting layer 29 and the second charge injection layer 25 were deposited successively). As a result, since the second charge transporting layer 29 and the second charge injection layer 25 contain the same matrix organic material 60, the matrix organic material 60 is successive at the interface between the second charge transporting layer 29 and the second charge injection layer 25, so that the composition does not rapidly change at the interface.

Figure 4:
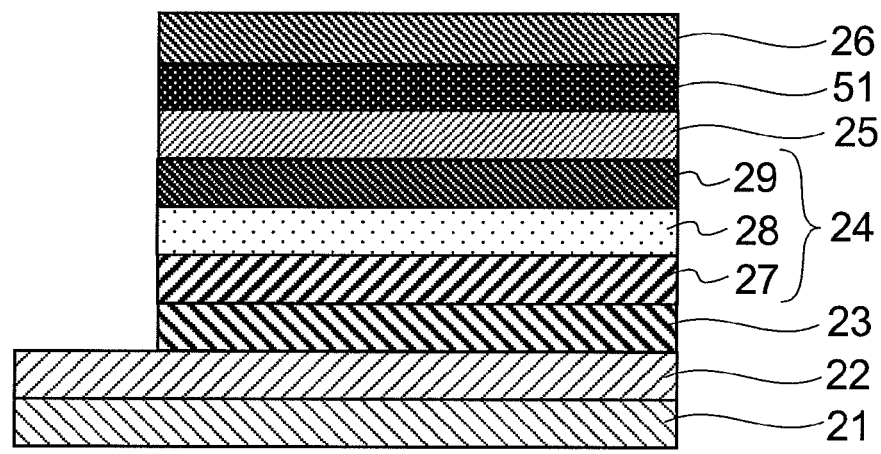
FIG. 4 is a sectional view for illustrating an organic EL device in which a first auxiliary charge injection layer is formed on a second charge injection layer.

In the above-described example, although the electrode layer 26 is formed on a surface of the second charge injection layer 25 composed of the mixed layer of the matrix organic material 60 and the charge injectable metallic layer 61, the invention is not limited thereto. It may be that, as shown in FIG. 4, a first auxiliary charge injection layer 51 made of a thin film of the charge injectable metallic material 61 is formed in close contact on the surface of the second charge injection layer 25 in which the matrix organic material 60 and the charge injectable metallic material 61 are mixed, and an electrode layer 26 is formed on the first auxiliary charge injection layer 51.

For example, it may be that, after the second charge injection layer 25 is formed, the object is carried out from the vapor deposition equipment 10, and the first auxiliary charge injection layer 51 made of the thin film of the charge injectable metal is formed on the surface of the second charge injection layer 25 in another vapor deposition equipment.

Meanwhile, it may be that the discharging of the matrix organic material 60 from the first vapor deposition source 13a is stopped while the object is not carried out from the second vapor deposition equipment 10; the vapor of the charge injectable metallic material 61 reaches the surface of the second charge injection layer 25 without reaching the vapor of the matrix organic material 60 thereto; and the first auxiliary charge injection layer 51 is formed on the surface of the second charge injection layer 25.

In this way, when the first auxiliary charge injection layer 51 is formed on the surface of the second charge injection layer 25 and the electrode layer 26 is formed on the surface of the first auxiliary charge injection layer 51 by sputtering, the injection efficiency of the charges injected from the second charge injection layer 25 to the second charge transporting layer 29 is increased.

According to the above-described embodiments, in the second charge injection layer 25, the composition of the matrix organic material 60 and the charge injectable metallic material 61 did not change in the film thickness direction; and the mixed proportion was constant in the film thickness direction. However, the invention is not limited thereto. The composition may be changed such that the proportion of the matrix organic material 60 is larger in a position nearer to the second charge transporting layer 29 inside the second charge injection layer 25, whereas the proportion of the charge injectable metallic material 61 is greater in a remoter position. In summary, the nearer the second charge transporting layer 29 comes, the greater the proportion of the matrix organic material 60 inside the second charge injection layer 25 can be made.

In this case, the charge injection efficiency of the second charge injection layer 25 can be increased even if the first auxiliary charge injection layer 51 is not formed on the surface of the second charge injection layer 25.

EXAMPLES $Alq_3$ [Tris(8-hydroxyquinoline)aluminum] as the matrix organic material 60 of the second charge injection layer 25 and lithium as the charge injectable metallic material 61 were disposed inside the first and second vapor deposition sources 13a, 13b, and the respective materials were evaporated; and a vapor of $Alq_3$ and that of lithium were discharged, respectively, and together reached the surface of the first organic layer 24, so that a mixed layer composed of a thin film in which lithium was mixed in a weight ratio of 2% against $Alq_3$ was formed as the second charge injection layer 25. An electrode layer 26 composed of a thin film of aluminum was formed on a surface of the second charge injection layer 25 by a sputtering method or a vapor deposition method. Light was generated by the application of a voltage between the wiring layer 22 and the electrode layer 26; and the luminescent intensity and the magnitude of the flowed electric current were measured.

Figure 5:
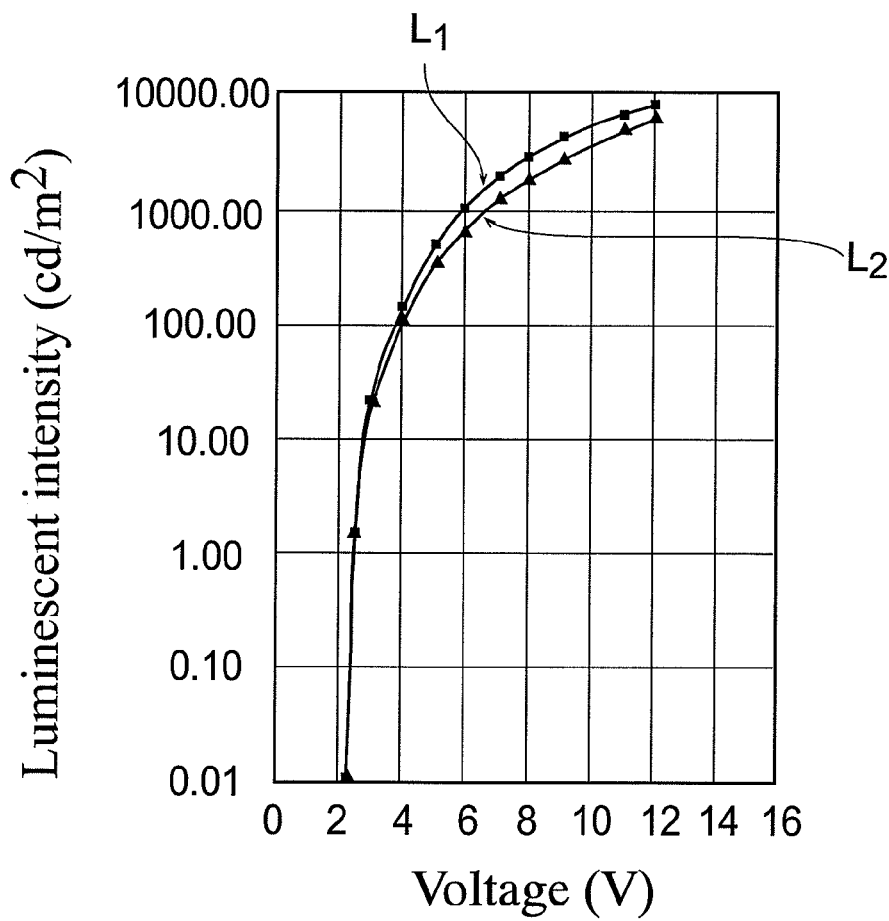
FIG. 5 is a graph for illustrating the relationship between the voltage and the luminescent intensity in the organic EL device of the present invention and the organic EL device of a Comparative Example.

FIG. 5 shows measurement results. In FIG. 5, the abscissa denotes the magnitude of the applied voltage; and the ordinate denotes the luminescent intensity. In the same figure, a reference numeral $L_1$ shows measurement results of the organic EL device in the Comparative Example in which aluminum was vapor deposited; and a reference numeral $L_2$ shows measurement results of the organic EL device 40 of the present invention in which the aluminum target was sputtered.

From these graphs, a difference in the luminescent intensity between the organic EL device 40 of the present invention and that of the Comparative Example was not observed.

Since the area of the luminescent layer 28 of each device is preliminarily grasped, the electric current density can be calculated from this area; and further, the luminescent efficiency can be calculated from the luminescent intensity and the measured electric current.

Figure 6:
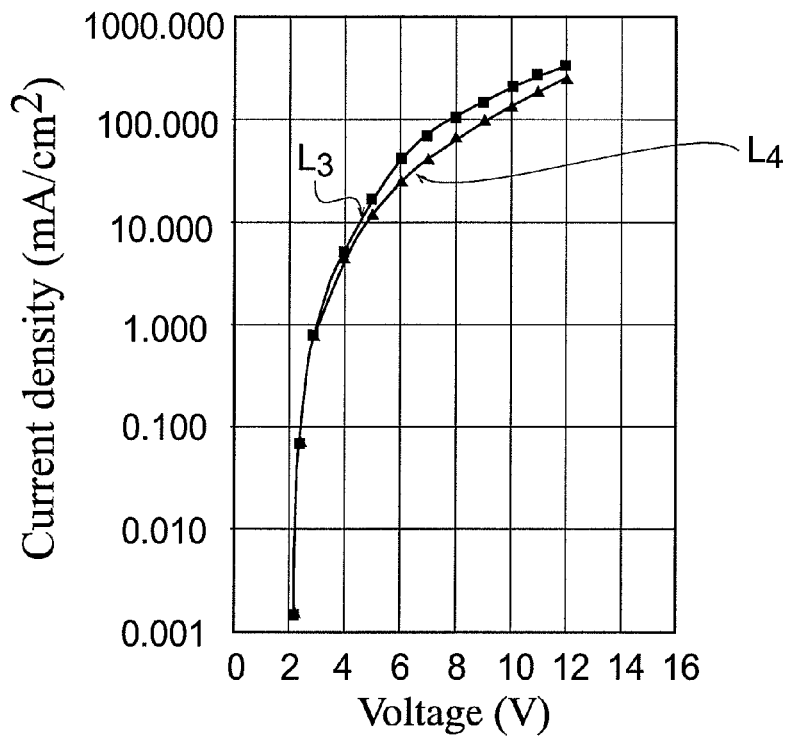
FIG. 6 is a graph for illustrating the relationship between the voltage and the electric current density in the organic EL device of the present invention and the organic EL device of a Comparative Example.

In FIG. 6, the abscissa denotes the voltage; and the ordinate denotes the electric current density. A reference numeral $L_3$ is a curve showing the relationship between the applied voltage and the electric current density of the organic EL device in the Comparative Example, whereas a reference numeral $L_4$ is a curve showing the relationship between the applied voltage and the electric current density of the organic EL device 40 of the present invention.

Figure 7:
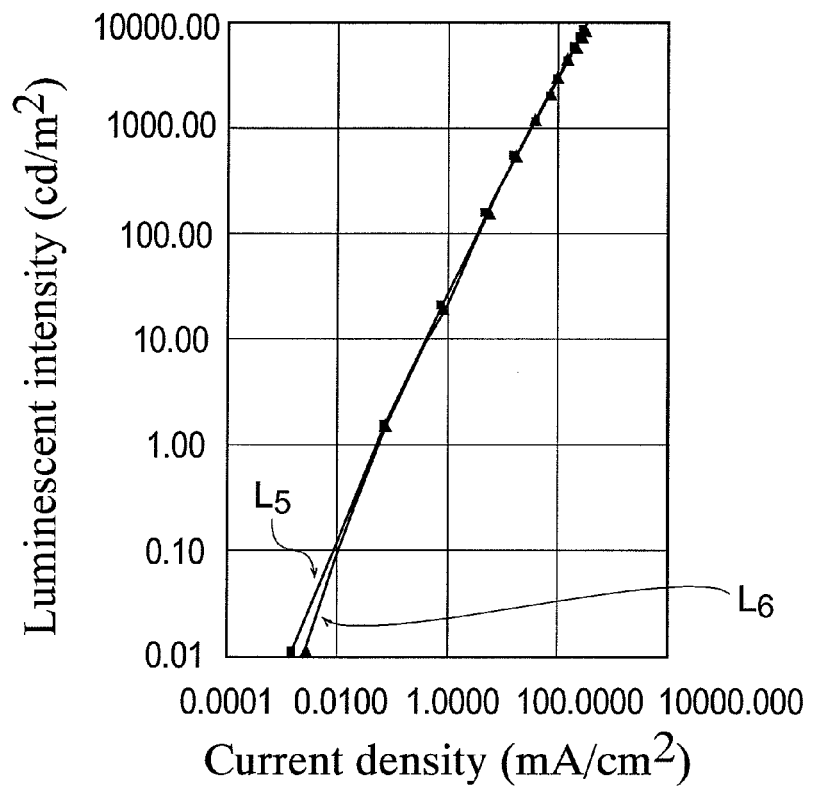
FIG. 7 is a graph for illustrating the relationship between the electric current density and the luminescent intensity in the organic EL device of the present invention and the organic EL device of a Comparative Example.

In FIG. 7, the abscissa denotes the electric current density; and the ordinate denotes the luminescent intensity. A reference numeral $L_5$ is a curve showing the relationship of the luminescent intensity with respect to the electric current density of the organic EL device in the Comparative Example; and a reference numeral $L_6$ is a curve showing the relationship of the luminescent intensity with respect to the electric current density of the organic EL device 40 of the present invention.

Figure 8:
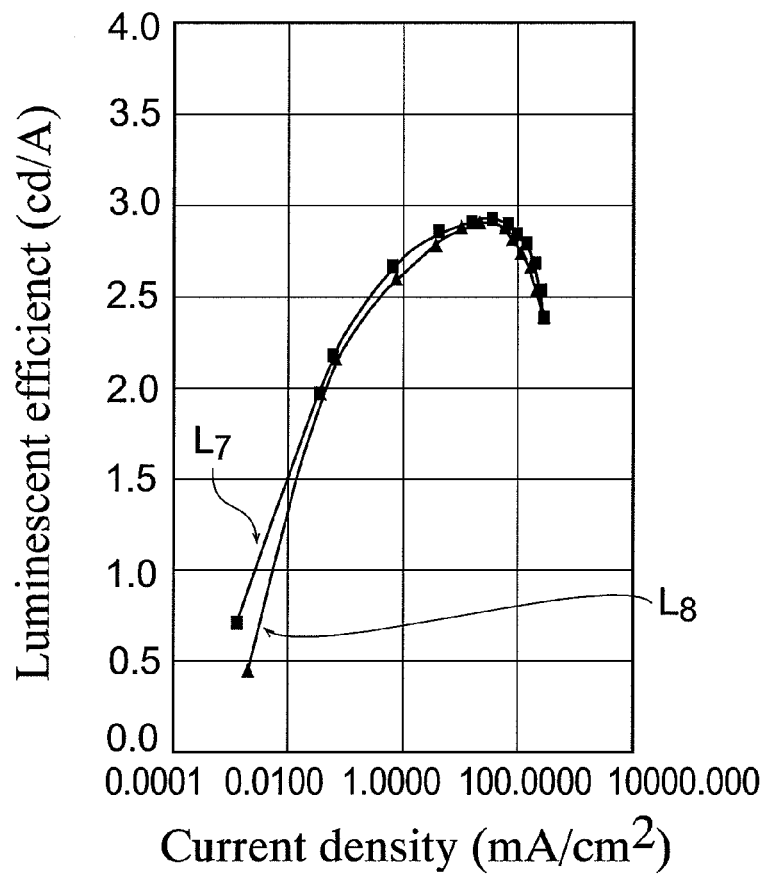
FIG. 8 is a graph for illustrating the relationship between the electric current density and the luminescent efficiency in the organic EL device of the present invention and the organic EL device of a Comparative Example.
Figure 9:
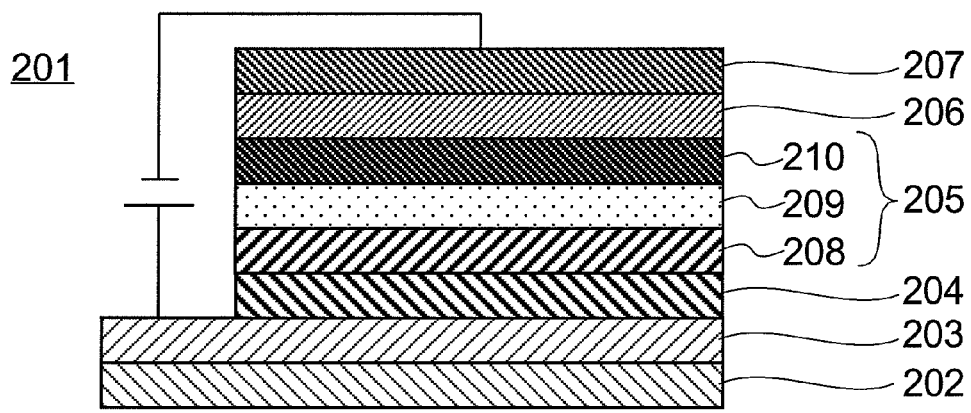
FIG. 9 is a sectional view for illustrating the conventional organic EL device.

In FIG. 8, the abscissa denotes the electric current density; and the ordinate denotes the luminescent intensity. A reference numeral $L_7$ is a curve showing the relationship of the luminescent efficiency with respect to the electric current density of the organic EL device in the Comparative Example; and a reference numeral $L_8$ is a curve showing the relationship of the luminescent efficiency with respect to the electric current density of the organic EL device 40 of the present invention.

As is seen from FIGS. 6, 7 and 8, differences in the electric current density, the luminescent intensity and the luminescent efficiency between the organic EL device 40 of the present invention and that of the Comparative Example were not observed.

In other words, even when the electrode layer 26 is formed, by the sputtering method, on the surface of the second charge injection layer 25 formed as the mixed layer of Alq$_3$ and lithium, none of the electric current density, the luminescent intensity and the luminescent efficiency decreases.

Figure 14:
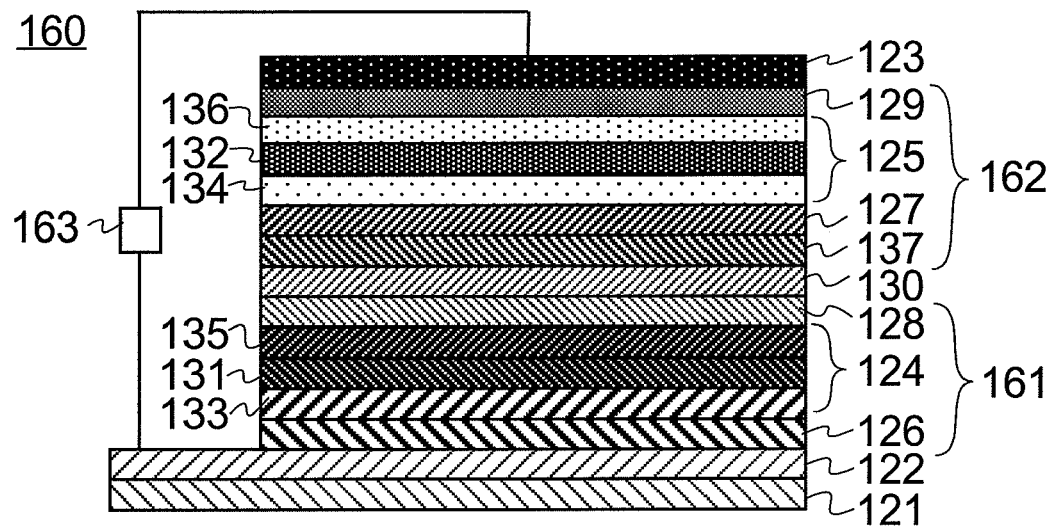
FIG. 14 is a sectional view for illustrating a step of producing an organic EL device of the present invention.
Figure 15:
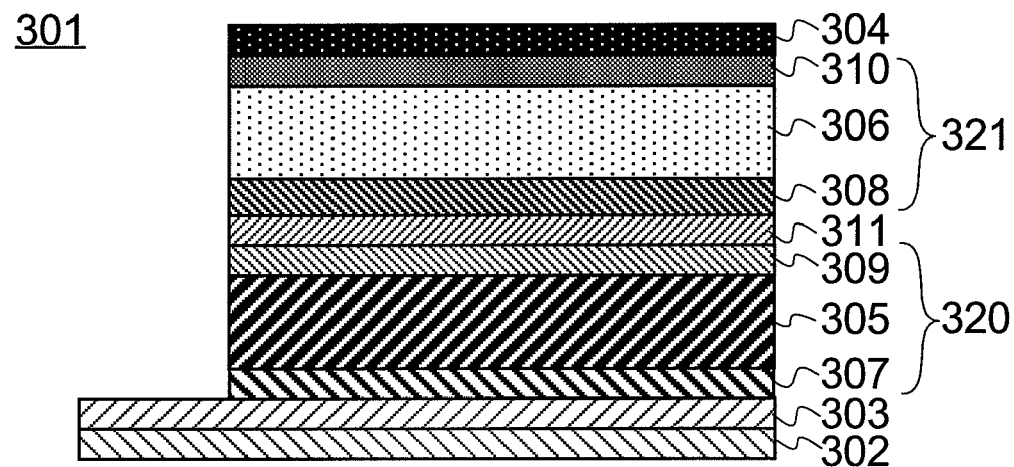
FIG. 15 is a sectional view for illustrating the conventional organic EL device.

Next, FIG. 14 is a sectional view of an organic EL device 160 as a second embodiment of the present invention.

This organic EL device 160 has a plate-like substrate 121; and a wiring layer 122 is provided on the substrate 121. A first luminescent part 161 is disposed on the wiring layer 122; an electrode layer 130 is disposed on the first luminescent part 161; a second luminescent part 162 is disposed on the electrode layer 130; and an electrode layer 123 is disposed on the second luminescent part 162.

The first and second luminescent parts 161, 162 have first and second organic layers 124, 125, respectively; the first and third charge injection layer 126, 127 are disposed on surfaces of the first and second organic layers 124, 125 at sides of the substrate 121, respectively; and second and fourth charge injection layers 128, 129 are disposed on surfaces at the opposite sides, respectively.

A first auxiliary charge injection layer 137 is disposed between the electrode layer 130 and the third charge injection layer 127; and a surface of the third charge injection layer 127 at a side of the substrate 121 is adhered to the first auxiliary charge injection layer 137. Further, the second charge injection layer 128 is adhered to the electrode layer 130 in the first luminescent part 161; and the first auxiliary charge injection layer 137 is adhered to the electrode layer 130 in the second luminescent part 162.

Both the first and third charge injection layers 126, 127 have the same polarity, and contain a material capable of injecting either charges of holes or electrons into portions in contact with the first and second organic layers 124, 125. Both the second and fourth charge injection layers 128, 129 have the same polarity, and contain materials to inject charges having polarity opposite to the first and third charge injection layers 126, 127 into the portions in contact with the first and second organic layers 124, 125.

Therefore, when the first and third charge injection layers 126, 127 contain the material capable of injecting the holes, the second and fourth charge injection layers 128, 129 contain the material capable of injecting the electrons. In this case, when a positive voltage is applied to the first and third charge injection layers 126, 127 and a negative voltage is applied to the second and fourth charge injection layers 128, 129, holes are injected from the first and third charge injection layers 126, 127 into the first and second organic layers 124, 125 to which the first to fourth charge injection layers 126 to 129 contact; and electrons are injected thereinto from the second and fourth charge injection layers 128, 129.

Meanwhile, when the first and third charge injection layers 126, 127 contain the materials capable of injecting electrons, the second and fourth charge injection layers 128, 129 contain the materials capable of injecting holes. When a negative voltage is applied to the first and third charge injection layers 126, 127 and a positive voltage is applied to the second and fourth charge injection layers 128, 129, electrons are injected from the first and third charge injection layers 126, 127 into the first and second organic layers 124, 125 to which the first to fourth charge injection layers 126 to 129 contact; and holes are injected thereinto from the second and fourth charge injection layers 128, 129.

The first auxiliary charge injection layer 137 contains a metal capable of injecting charges having the same polarity as that of the charges which the third charge injection layer 127 injects into the second organic layer 125. A voltage having the same polarity as that of the third charge injection layer 127 is applied; the charges are injected into the third charge injection layer 127; and the injected amount of the charges from the third charge injection layer 127 into the second organic layer 125 increases.

As described above, the first auxiliary charge injection layer 137 is adhered to the third charge injection layer 127.

When the second charge injection layer 128 contains a material capable of injecting electrons into the first organic layer 124 and the third charge injection layer 127 contains a material capable of injecting holes into the second organic layer 125, a work function of the material constituting the first auxiliary charge injection layer 137 is greater than that of the material constituting the electrode layer 130.

When the second charge injection layer 128 contains a material capable of injecting holes into the first organic layer 124 and the third charge injection layer 127 contains a material capable of injecting electrons into the second organic layer 125, a work function of the material constituting the first auxiliary charge injection layer 137 is smaller than that of the material constituting the electrode layer 130.

The below-described second auxiliary charge injection layer may be formed on a surface of the electrode layer 130 at a side opposite to a side on which the first auxiliary charge injection layer 137 is formed.

The relationship in magnitude in the work function between the material constituting the second auxiliary charge injection layer and the material constituting the electrode layer 130 is inverse to the relationship in magnitude in the work function between the material constituting the first auxiliary charge injection layer 137 and the material constituting the electrode layer 130.

The electrode layer 130, which is constituted by a thin film of a metallic material, separates the second charge injection layer 128 and the first auxiliary charge injection layer 137 which have different polarities from each other, and electrically connects the second charge injection layer 128 and the third charge injection layer 127 via the first auxiliary charge injection layer 137.

When the wiring layer 122 and the electrode layer 123 are connected to a power source 163 and a voltage is applied between the wiring layer 122 and the electrode layer 123, voltages are applied between the first charge injection layer 126 contacting the wiring layer 122 and the second charge injection layer 128 connected to the electrode layer 130 and between the fourth charge injection layer 129 contacting the electrode layer 123 and the third charge injection layer 127 connected to the electrode layer 130.

The voltage applied to each of the charge injection layers 126 to 129 has the polarity which makes the material contained in each of the charge injection layers 126 to 129 inject charges that can be injected into the first and second organic layers 124, 125 and that the injected charges are both recombined inside the first and second organic layers 124, 125, and generate light.

The first and second organic layers 124, 125 have first and second luminescent layers 131, 132; first and third charge transporting layers 133, 134 are disposed on surfaces of the first and second luminescent layers 131, 132 at sides of the substrate 121, respectively, while second and fourth charge transporting layers 135, 136 are disposed on surfaces at the opposite sides, respectively.

When charges injected into the first and second organic layers 124, 125 are transported toward the first and second luminescent layers 131, 132 in the first to fourth charge transporting layers 133 to 136 inside the first and second organic layers 124, 125, respectively, and reach the first and second luminescent layers 131, 132, respectively, they are both recombined inside the first and second luminescent layers 131, 132 and generate light.

In this case, the substrate 121 is a glass substrate; the wiring layer 122 on the substrate 121, the second organic layer 125 and each of the layers 124, 126 to 128, 130 and 137 therebetween are transparent; and the light radiated in the first organic layer 124 is emitted from the first organic layer 124 to the outside of the substrate 121 through the first charge injection layer 126 and the wiring layer 122. The light radiated in the second organic layer 125 is emitted to the outside of the substrate 121 through each of the layers 127, 137, 130, 128, 124, 126, 122 between the second organic layer 125 and the substrate 121. The light from the second organic layer 125 is emitted to the same side as the light from the first organic layer 124; and a strongly emitted light which combines both lights is observed at a position at the side of the substrate 121 outside the organic EL device 160.

According to the present invention, as described later, the second and fourth charge injection layers 128, 129 are constituted by thin films in which a matrix organic material 170 and a charge injectable metallic material 171 are mixed. The charge injectable metallic material 171 has charge injectability; and the matrix organic material 170 is an organic material which transports charges having the same polarity as that of the charges injected by the charge injectable metallic material 171.

Figure 10:
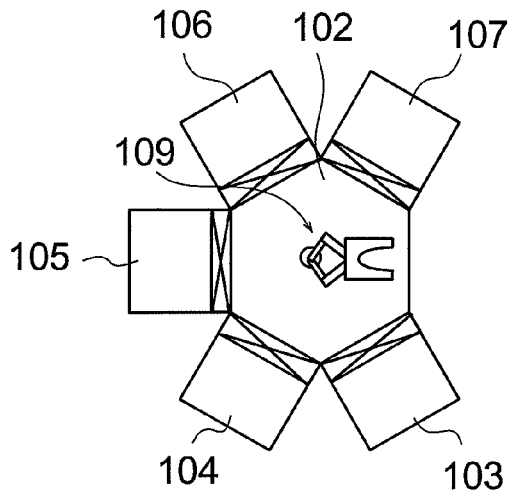
FIG. 10 is a block diagram for illustrating an apparatus for producing an organic EL device of the present invention.

In FIG. 10, a reference numeral 101 denotes an apparatus for producing the organic EL device 160 of the present invention.

This producing apparatus 101 has a transporting equipment 102; and a carry-out equipment 103, a carry-in equipment 104, first and second vapor deposition equipments 105, 106 and a sputtering equipment 107 are connected to the transporting equipment 102, respectively.

Disposed inside the transporting equipment 102 is a substrate carriage robot 109, which enables the substrate to be carried in and out among the respective equipments 102 to 107.

Figure 12:
FIGS. 12 (a) to (d) are sectional views for illustrating steps of producing an organic EL device of the present invention.
Figure 12:
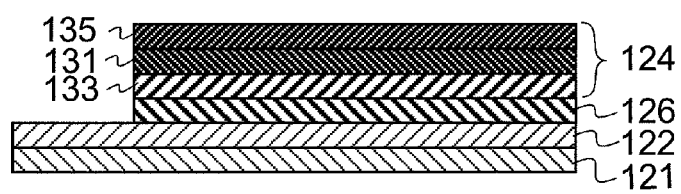
Figure 12:
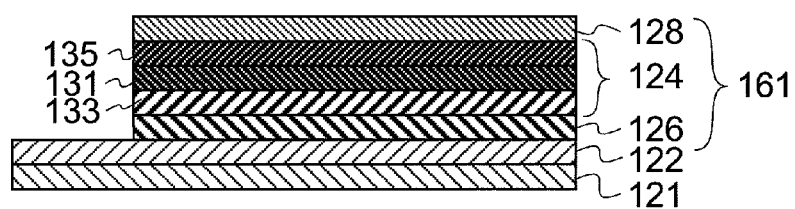
Figure 12:
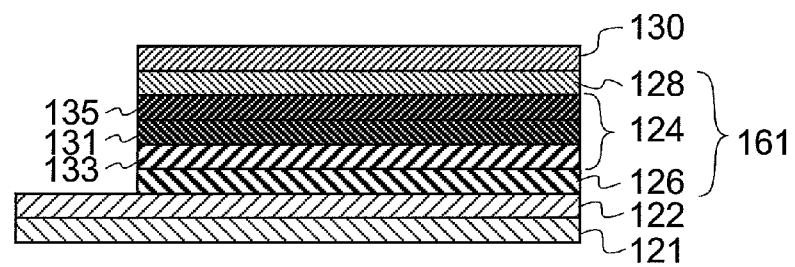

An object 120 to be film-formed as shown in FIG. 12(a) has a substrate 121; and a wiring layer 122 is formed on a surface of the substrate 121. A plurality of the objects 120 to be film-formed is preliminarily disposed inside the carry-in equipment 104.

Each of the equipments 102 to 107 is shielded from the atmosphere, and evacuated under vacuum.

In the following description, steps of forming the organic EL device 160 of the present invention will be explained with reference to the drawings.

The objects 120 to be film-formed are moved from the carry-in equipment 104 into the first vapor deposition equipment 105. Inside the first vapor deposition equipment 105 are disposed four vapor deposition sources in which the organic compounds constituting the first charge injection layer 126, the first charge transporting layer 133, the first luminescent layer 131 and the second charge transporting layer 135 are disposed, respectively.

A vapor of the organic compound is discharged from the vapor deposition source in which the organic compound corresponding to the composition of the first charge injection layer 126 is disposed; and the first charge injection layer 126 of an organic thin film is formed on a surface of the wiring layer 122.

After the first charge injection layer 126 is formed, vapors of the organic compositions corresponding to the compositions of the first charge transporting layer 133, the first luminescent layer 131 and the second charge transporting layer 135 are successively discharged from the respective vapor deposition sources; and a first charge transporting layer 133 of an organic thin film, a first luminescent layer 131 of an organic thin film and a second charge transporting layer 135 of an organic thin film are formed on the first charge injection layer 126 in this order (FIG. 12(b)).

The objects 120 to be film-formed on which the first organic layer 124 is formed is moved from the interior of the first vapor deposition equipment 105 into a vacuum chamber 111 of the second vapor deposition equipment 106.

Figure 11:
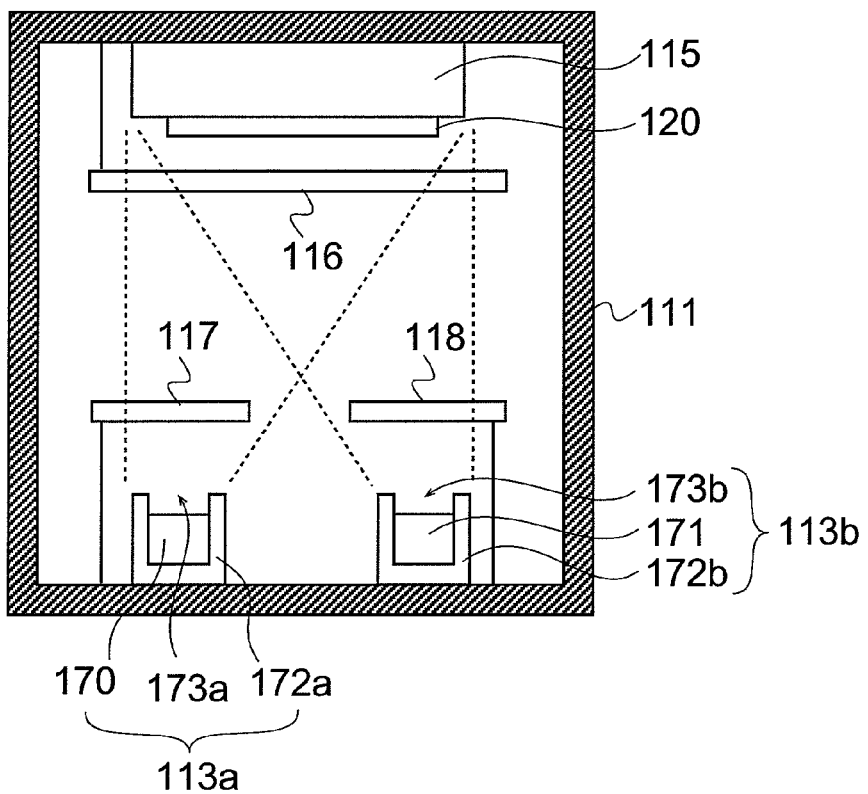
FIG. 11 is a sectional view for illustrating a second vapor deposition equipment.

FIG. 11 is a sectional view for illustrating the interior of the second vapor deposition equipment 106. The carried-in objects 120 to be film-formed have exposed surfaces of the second charge transporting layers 135, and are held by a substrate holder 115 inside the vacuum chamber 111, while the second charge transporting layers 135 are directed downwardly.

The first vapor deposition source 113a and the second vapor deposition source 113b are disposed under the substrate holder 115 inside the vacuum chamber 111. The matrix organic material 170 and the charge injectable metallic material 171 constituting the second charge injection layer 128 are separately placed in a vapor deposition vessel 172a of the first vapor deposition source 113a and a vapor deposition vessel 172b of the second vapor deposition source 113b.

The matrix organic material 170 and the charge injectable metallic material 171 inside the first and second vapor deposition sources 113a, 113b are preliminarily heated by passing electric current through heaters of the first and second vapor deposition sources 113a, 113b.

After the objects 120 to be film-formed are disposed on the substrate holder 115, the first and second vapor deposition sources 113a, 113b are further heated in a state such that shielding is affected with respective shutters 116 to 118 among the substrate holder 115 and the first and second vapor deposition sources 113a, 113b; and the vapor of the matrix organic material 170 and that of the charge injectable metallic material 171 are discharged through discharge openings 173a, 173b provided in the first vapor deposition source 113a and the second vapor deposition source 113b, respectively.

At the time when the evaporating state and the discharging speeds of the matrix organic material 170 and the charge injectable metallic material 171 are stabilized, each of the shutters 116 to 118 among the substrate holder 115 and the first and second vapor deposition sources 113a, 113b is opened, and the vapor of the matrix organic material 170 and that of the charge injectable metallic material 171 are discharged into the vacuum chamber 111, respectively.

The first and second vapor deposition sources 113a, 113b are set near each other; the substrate holder 115 is disposed at a position which both the vapors reach; and a thin film in which the matrix organic material 170 and the charge injectable metallic material 171 are mixed begins to be formed on a surface of the second charge transporting layer 135.

The thin film in which the matrix organic material 170 and the charge injectable metallic material 171 are mixed is developed for a predetermined time period; and when it reaches a predetermined film thickness, the growth of the thin film is terminated by shutting the respective shutters 116 to 118.

Accordingly, a second charge injection layer 128 of the thin film in which the matrix organic material 170 and the charge injectable metallic material 171 are mixed is formed(FIG. 12(c)).

The objects 120 to be film-formed on which the second charge injection layer 128 is formed are moved from the vacuum chamber 111 into the first sputtering equipment 107. A first target of a metallic material to form an electrode and a second target of a metallic material having charges injection characteristic of the same polarity as that of the third charge injection layer 127 are disposed inside the vacuum chamber. A transparent electrode layer 130 of the metallic material is formed on a surface of the second charge injection layer 128 exposed inside the vacuum chamber by the introduction of a sputtering gas inside the vacuum chamber and sputtering the first target (FIG. 12(d)); and a first auxiliary charge injection layer 137 of the metallic material is formed on a surface of the electrode layer 130 by sputtering the second target (FIG. 13(a)).

Figure 13:
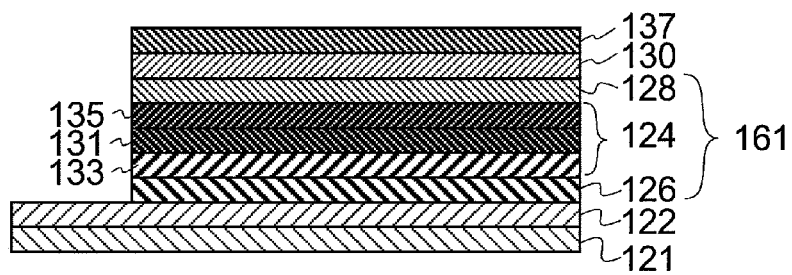
FIGS. 13 (a) to (c) are sectional views for illustrating steps of producing an organic EL device of the present invention.
Figure 13:
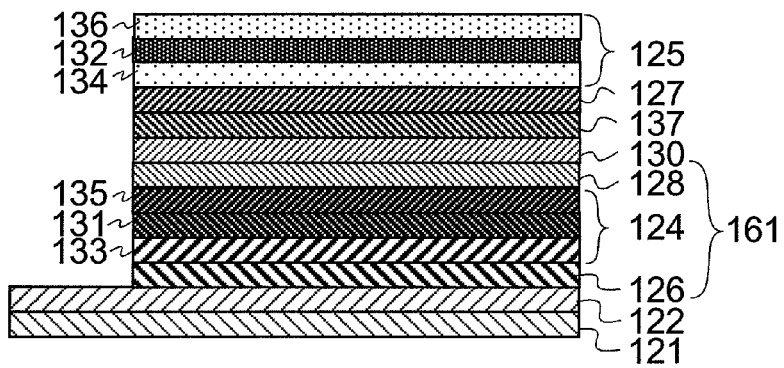
Figure 13:
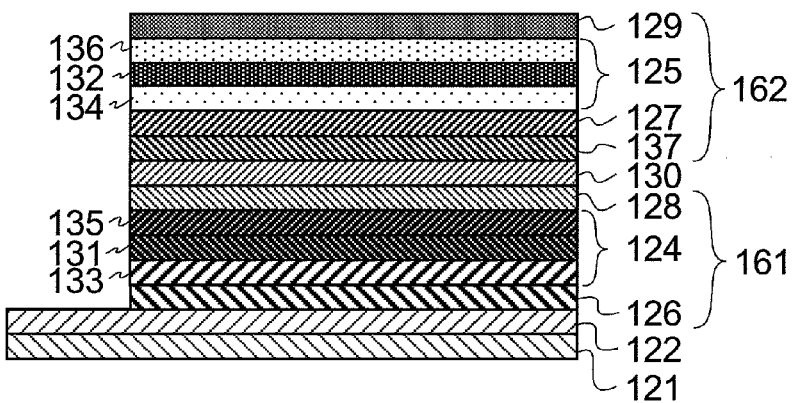

The objects 120 to be film-formed on which the first auxiliary electrode injection layer 137 is formed are moved from the sputtering equipment 107 into the first vapor deposition equipment 105; vapors of the same materials as that in forming the first charge injection layer 126, the first charge transporting layer 133, the first luminescent layer 131 and the second charge transporting layer 135 are discharged under the same film forming condition in the same order; and the third charge injection layer 127, the third charge transporting layer 134, the second luminescent layer 132 and the fourth charge transporting layer 136 are formed on a surface of the first auxiliary charge injection layer 137 in this order in the same film thicknesses and same compositions as in the case of the first charge injection layer 126, the first charge transporting layer 133, the first luminescent layer 131 and the second charge transporting layer 135, respectively (FIG. 13(b)).

The objects 120 to be film-formed on which the second organic layer 125 is formed are moved from the first vapor deposition equipment 105 into the second vapor deposition equipment 106. A fourth charge injection layer 129 having the same film thickness and the same composition as the second charge injection layer 128 is formed on a surface of the second organic layer 125 from the same material under the same film forming condition as when the second charge injection layer 128 is formed(FIG. 13(c)).

The objects 120 to be film-formed on which the fourth charge injection layer 129 is formed are moved from the second vapor deposition equipment 106 into the sputtering equipment 107, and the electrode layer 123 is formed from the same material with the same composition under the same film forming condition as in the formation of the electrode layer 130.

The objects 120 to be film-formed on which the electrode layer 123 is formed are moved from the sputtering equipment 107 into the carry-out equipment 103, and consequently assembled, thereby obtaining organic EL devices 160 (FIG. 14).

In this example, $Alq_3$ [Tris(8-hydroxyquinoline) aluminum] as the matrix organic material 170 and lithium as the charge injectable metallic material 171, which constitute the second and fourth charge injection layers 128, 129, are separately placed in the first and second vapor deposition sources 113a, 113b. A vapor of $Alq_3$ and that of lithium respectively are discharged by evaporating these materials, respectively, and brought together to the surfaces of the second and fourth charge transporting layers 135, 136, so that the respective second and fourth charge injection layers 128, 129 of thin films in which $Alq_3$ and lithium are mixed are formed.

$Alq_3$ has electron transportability, and lithium has electron injectability, so that the second and fourth charge injection layers 128, 129 inject and transport electrons into the first and second organic layers 124, 125.

In this case, the first and third charge injection layers 126, 127 are constituted by thin films of an organic compound capable of injecting holes into the first and second organic layers 124, 125.

In this case, regarding the electrode layer 130, aluminum is used as the metal constituting the first target; and the electrode layer 130 constituted by a thin film of aluminum is formed on a surface of the second charge injection layer 128.

In this case, regarding the first auxiliary charge injection layer 137, silver is used as a metal constituting the second target; and the first auxiliary charge injection layer 137 constituted by a thin film of silver is formed on a surface of the electrode layer 130.

Silver has hole injectability, and is a material for injecting charges having the same polarity as that of the charges injected by the third charge injection layer 127.

At this time, a positive voltage is applied to the first and third charge injection layers 126, 127; a negative voltage is applied to the second and fourth charge injection layers 128, 129; holes are injected into the first and second organic layers 124, 125 from the first and third charge injection layers 126, 127, respectively; and electrons are injected thereinto from the second and fourth charge injection layers 128, 129, respectively.

When the second and fourth charge injection layers 128, 129 are formed in close contact with the surfaces of the second and fourth charge transporting layers 135, 136, respectively, and if the organic material contained in the second and fourth charge transporting layers 135, 136 are the same as the matrix organic material 170 contained in the second and fourth charge injection layers 128, 129, the second charge transporting layer 135 and the second charge injection layer 128 adhered to each other and the fourth charge transporting layer 136 and the fourth charge injection layer 129 contain the same matrix organic material 170, so that changes in the composition at their interfaces become gentle. Thus, when thin films are formed on the surface of the second and fourth charge injection layers 128, 129 by the sputtering method, the interfaces are not disturbed, and the characteristics thereof are not deteriorated.

When the second and fourth charge injection layers 128, 129 are formed and if the discharge amounts per unit time from the first and second vapor deposition sources 113a, 113b are made constant, the composition in the film thickness direction does not change, so that the second and fourth charge injection layers 128, 129 having a constant mixed ratio in the film thickness direction can be obtained.

Further, when the second and fourth charge injection layers 128, 129 are formed and if the vapor of the charge injectable metallic material 171 is gradually increased by adjusting the temperatures of the first and second vapor deposition sources 113a, 113b, the proportion of the matrix organic material 170 inside the second and fourth charge injection layers 128, 129 can be made greater in a position nearer to the second and fourth charge transporting layers 135, 136, while the proportion of the charge injectable metallic material 171 can be made larger in a position that is more remote therefrom. In summary, the nearer the second and fourth charge transporting layers 135, 136 comes, the larger the proportion of the matrix organic material 170 inside the second and fourth charge injection layers 128, 129 becomes, thereby enhancing the charge injection efficiency.

Meanwhile, in the present invention, the electrode layer 130 is formed in close contact with the surface of the second charge injection layer 128, but the present invention is not limited thereto. It may be that a second auxiliary charge injection layer is a thin film of a material to inject, on the surface of the second charge injection layer 128, charges having the same polarity as the charge injectable metallic material 171 contained in the second charge injection layer 128; the second auxiliary charge injection layer to inject the charges having the same polarity is formed; the electrode layer 130 is formed with adherence onto the surface of the second auxiliary charge injection layer; and the charge injection efficiency of the second charge injection layer 128 is enhanced.

For example, a thin film of the charge injectable metallic material 171 contained in the second charge injection layer 128 can be used for this second auxiliary charge injection layer.

When the charge injectable metallic material 171 contained in the second charge injection layer 128 is lithium, a thin film of lithium or a thin film of lithium fluoride can be used for the second auxiliary charge injection layer.

Similar to the second charge injection layer 128, the fourth charge injection layer 129 may be made uniform in the film thickness direction, or the content of the charge injectable metallic material 171 maybe made smaller at a bottom face and greater at a surface by changing the composition in the fourth charge injection layer 129.

Moreover, it may be that the second auxiliary charge injection layer made of a metal of the same polarity is formed on a surface of the fourth charge injection layer 129 and an electrode layer 123 is formed on a surface of this second auxiliary charge injection layer.

In addition, it may be that the fourth charge injection layer 129 is constituted not by the mixed thin film of the matrix organic material 170 and the charge injectable metallic material 171, but by, for example, a metallic film of lithium.

When light is radiated toward a side of the electrode layer 123 opposite to that of the substrate 121, the fourth charge injection layer 129 and the electrode layer 123 have only to be made transparent.

$Alq_3$ is used as the matrix organic material 170 in the present invention, but the invention is not limited to $Alq_3$. Any organic material capable of transporting charges of the same polarity as the charges to be injected into the second and fourth charge transporting layers 135, 136 by the charge injectable metallic layer 171 can be used.

When an organic compound other than $Alq_3$ is contained in the second and fourth charge transporting layers 135, 136, $Alq_3$ may be used. Since the compositions of the second and fourth charge transporting layers 135, 136 and the second and fourth charge injection layers 128, 129 can be continuously changed, it is desirable to use the same organic compound as the organic compounds contained in the second and fourth charge transporting layers 135, 136.

Moreover, in the present invention, silver is used as the material for the first charge injection layers 23, 126 of the organic EL devices 40, 160 in the first and second embodiments, but the invention is not limited thereto. A material for injecting charges of a polarity inverse to that of the charges injected by the second charge injection layers 25, 128 can be used.

Meanwhile, lithium is used as the charge injectable metallic material of the organic EL devices 40, 160 in the first and second embodiments as discussed above, but the present invention is not limited to lithium. For example, as to the electron injection material, a metallic material containing an alkali metal element (such as, cesium) or an alkaline earth metal element (such as, magnesium) can be used.

Furthermore, the organic EL devices 40, 160 in the above-discussed first and second embodiments, $Alq_3$ is used as the matrix organic material, but the material is not limited to $Alq_3$. An organic material for transporting charges of the same polarity as that of the charges which the charge injectable metallic material injects into the second charge transporting layers 29, 135 can be used. In particular, the matrix organic material is preferably an organic material composed of an organic compound contained in the second charge transporting layers 29, 135.

Further, in the organic EL devices 40, 160 of the above-discussed first and second embodiments, 2% of lithium is mixed with respect to $Alq_3$ in the second and fourth charge injection layers 25, 128, 129, but the mixing ratio is not limited thereto. The weight ratio may be 2% or more.

Further, aluminum is used for the electrode layers 26, 123, 130, but the present invention is not limited to aluminum and another metal may be used.

Furthermore, in the organic EL devices 40, 160 of the above-discussed first and second embodiments, lithium is used as the charge injectable metallic material, but it is not limited to lithium. In the case of the electron injectable material, a metallic material containing an alkali metal element (such as, cesium) or an alkaline earth metal element (such as, magnesium) can be used.

In addition, in the case of the organic EL devices 40, 60 of the above first and second embodiments, aluminum is used as the metallic material for the electrode layers 26, 123, 130, but it is not limited to the use of aluminum and another metallic material can be used.

Moreover, silver is used as the metallic material for the first auxiliary charge injection layer 137, but it is not limited to silver. In the case of the hole injection material, ITO (Indium-Tin-Oxide), IZO (Indium-Zinc-Oxide), ZnOx (Zinc Oxide), SnOx (Tin Oxide), InOx (Indium oxide) or the like can be used. In particular, a metallic material which can form a transparent thin film is desired.

In addition, when the fourth charge injection layer 129 is made of a metallic film, lithium can be used as the metal. However, the metal is not limited to lithium, but a thin film of an electron injectable metal (such as, cesium or magnesium) can be used. Further the thin film is not limited to the metal thin film, but a thin film of an electron injectable metal compound (such as, lithium fluoride or cesium fluoride) can be used.

Moreover, in the organic EL devices 40, 160 of the above first and second embodiments, ITO is used for the wiring layers 22, 122. However, since the ITO film has a hole injectability, the wiring layers 22, 122 also function as auxiliary charge injection layers for the first charge injection layers 23, 126 in contact with the wiring layers 22, 122, so that the hole injectability of the first charge injection layers 23, 126 is enhanced.

If the charge injection efficiency of the first and third charge injection layers 23, 126, 127 is high, the ITO film or the first auxiliary charge injection layer 137 may not be formed on the surfaces of the first and third charge injection layers 126, 127.

Furthermore, in order to produce the organic EL devices 40, 160 in the above-described first and second embodiments, an apparatus (cluster type apparatus) to form the thin films on the surfaces of the substrates which are moved through each of the equipments via the transporting equipments 2, 102 is used, but the apparatus is not limited thereto. An apparatus (in-line type apparatus) to form the thin films on the surfaces of the substrates which are moved among a plurality of film forming equipments and moved successively without passing through the transporting equipments 2, 102 may be used.

What is claimed is:

1. An organic EL device in which charges are injected into a luminescent layer of an organic thin film formed between a first electrode layer and a second electrode layer, thereby emitting a light, the organic EL device comprising:
a charge injection layer formed between the luminescent layer and the second electrode layer; and
a charge transporting layer formed between the luminescent layer and the charge injection layer,
wherein the charge transporting layer consists of a matrix organic material, the charge injection layer consisting of a thin film in which a charge injectable metallic material and the same matrix organic material as the charge transporting layer are mixed, the charge injectable metallic material is lithium, and a weight ratio of the lithium in the charge injection layer is at least 2%,
wherein the nearer the charge injection layer is to the charge transporting layer, the larger the proportion of the matrix organic material becomes, and
wherein a metallic film formed by a sputtering method is disposed on a surface of the charge injection layer.

2. The organic EL device according to claim 1, wherein the matrix organic material is $Alq_3$.

3. The organic EL device according to claim 2, wherein the weight ratio of the lithium in the charge injection layer is 2%.

4. The organic EL device according to claim 1, wherein the charge transporting layer is formed by being deposited by a vapor of the matrix organic material alone, and the charge injection layer is formed by being deposited by both a vapor of the matrix organic material and a vapor of the charge injectable metallic material.

5. An organic EL device producing method for producing an organic EL device having a luminescent layer of an organic thin film formed between a first electrode layer and a second electrode layer, a charge injection layer formed between the luminescent layer and the second electrode layer, and a charge transporting layer formed between the luminescent layer and the charge injection layer;

the organic EL device producing method comprising the steps of:
a charge transporting layer forming step in which the charge transporting layer is formed by depositing a vapor of a matrix organic material alone;
a charge injection layer forming step in which the charge injection layer is formed by depositing both the vapor of the matrix organic material and a vapor of the charge injectable metallic material; and
a second electrode layer forming step in which the second electrode layer on a surface of the charge injection layer is formed by a sputtering method,
wherein the charge injectable metallic material of the charge injection layer is lithium, and the weight ratio of the lithium in the charge injection layer is at least 2%, and
wherein, in the charge injection layer forming step, forming the charge injection layer with a higher proportion of the vapor of the matrix organic material than that of the charge injectable metallic material at a start of forming a film and with a higher proportion of the vapor of the charge injectable metallic material than that of the matrix organic material at the later step in the formation of a film in the vapor of the total of the matrix organic material and the charge injectable metallic material.

6. The organic EL device producing method according to claim 5, wherein the matrix organic material is $Alq_3$.

7. The organic EL device producing method according to claim 6, wherein the weight ratio of the lithium in the charge injection layer is 2%.

8. The organic EL device producing method according to claim 5, wherein generating the vapor of the matrix organic material in the charge transporting layer forming step and the vapor of the matrix organic material in the charge injection layer forming step is from the same vapor deposition source, the vapors being discharged into the same vacuum chamber, thereby forming the charge transporting layer and the charge injection layer in the same vacuum chamber.

9. An organic EL device in which charges are injected into a luminescent layer of an organic thin film formed between a first electrode layer and a second electrode layer, thereby emitting a light, the organic EL device comprising:
a charge injection layer formed between the luminescent layer and the second electrode layer;
a charge transporting layer formed between the luminescent layer and the charge injection layer; and
an auxiliary charge injection layer formed on the charge transporting layer,
wherein the charge transporting layer consists of a matrix organic material, the charge injection layer consisting of a thin film in which a charge injectable metallic material and the same matrix organic material as the charge transporting layer are mixed, the charge injectable metallic material is lithium,
wherein the nearer the charge injection layer is to the charge transporting layer, the larger the proportion of the matrix organic material becomes,
and
wherein a metallic film formed by a sputtering method is disposed on a surface of the auxiliary charge injection layer, the auxiliary charge injection layer comprising a thin film of the charge injectable metallic material.

10. An organic EL device producing method for producing an organic EL device having a luminescent layer of an organic thin film formed between a first electrode layer and a second electrode layer, a charge injection layer formed between the luminescent layer and the second electrode layer, and a charge transporting layer formed between the luminescent layer and the charge injection layer;

the organic EL device producing method comprising the steps of:
a charge transporting layer forming step in which the charge transporting layer is formed by depositing a vapor of a matrix organic material alone;
a charge injection layer forming step in which the charge injection layer is formed by depositing both the vapor of the matrix organic material and a vapor of the charge injectable metallic material;
an auxiliary charge injection layer forming step in which a thin film of the charge injectable materallic material is formed on the charge injection layer; and
a second electrode layer forming step in which the second electrode layer on a surface of the charge injection layer is formed by a sputtering method,
wherein the charge injectable metallic material of the charge injection layer is lithium, and
wherein, in the charge injection layer forming step, forming the charge injection layer with a higher proportion of the vapor of the matrix organic material than that of the charge injectable metallic material at a start of forming a film and with a higher proportion of the vapor of the charge injectable metallic material than that of the matrix organic material at the later step in the formation of a film in the vapor of the total of the matrix organic material and the charge injectable metallic material.

* * * * *